United States Patent

Wai et al.

[11] Patent Number: 6,132,491
[45] Date of Patent: Oct. 17, 2000

[54] METHOD AND APPARATUS FOR DISSOCIATING METALS FROM METAL COMPOUNDS EXTRACTED INTO SUPERCRITICAL FLUIDS

[75] Inventors: Chien M. Wai; Fred H. Hunt, both of Moscow, Id.; Neil G. Smart, Workington, United Kingdom; Yuehe Lin, Richland, Wash.

[73] Assignee: Idaho Research Foundation, Inc., Moscow, Id.

[21] Appl. No.: 09/137,563

[22] Filed: Aug. 20, 1998

Related U.S. Application Data

[60] Provisional application No. 60/056,749, Aug. 20, 1997, and provisional application No. 60/062,140, Oct. 3, 1997.

[51] Int. Cl.⁷ ............................. C21B 15/00; C22B 15/00
[52] U.S. Cl. ............................. 75/722; 75/717; 75/718; 75/720; 210/757; 210/761
[58] Field of Search ............................. 75/717, 718, 720, 75/722; 210/757, 761, 912

[56] References Cited

U.S. PATENT DOCUMENTS

| | | | |
|---|---|---|---|
| 4,970,093 | 11/1990 | Sievers et al. | 427/38 |
| 5,135,567 | 8/1992 | Volotinen et al. | 75/717 |
| 5,356,538 | 10/1994 | Wai et al. | 210/634 |
| 5,606,724 | 2/1997 | Wai et al. | 423/3 |
| 5,639,441 | 6/1997 | Sievers et al. | 424/9.3 |
| 5,730,874 | 3/1998 | Wai et al. | 210/638 |
| 5,770,085 | 6/1998 | Wai et al. | 210/638 |
| 5,789,027 | 8/1998 | Watkins et al. | 427/250 |
| 5,792,357 | 8/1998 | Wai et al. | 210/638 |

FOREIGN PATENT DOCUMENTS

| | | |
|---|---|---|
| WO 95/33541 | 12/1995 | WIPO . |
| WO 95/33542 | 12/1995 | WIPO . |
| WO 98/04754 | 2/1998 | WIPO . |

*Primary Examiner*—Prince Willis, Jr.
*Assistant Examiner*—Tima McGuthry-Banks
*Attorney, Agent, or Firm*—Klarquist Sparkman Campbell Leigh & Whinston, LLP

[57] ABSTRACT

A method for dissociating metal-ligand complexes in a supercritical fluid by treating the metal-ligand complex with heat and/or reducing or oxidizing agents is described. Once the metal-ligand complex is dissociated, the resulting metal and/or metal oxide form fine particles of substantially uniform size. In preferred embodiments, the solvent is supercritical carbon dioxide and the ligand is a β-diketone such as hexafluoroacetylacetone or dibutyldiacetate. In other preferred embodiments, the metals in the metal-ligand complex are copper, silver, gold, tungsten, titanium, tantalum, tin, or mixtures thereof. In preferred embodiments, the reducing agent is hydrogen. The method provides an efficient process for dissociating metal-ligand complexes and produces easily-collected metal particles free from hydrocarbon solvent impurities. The ligand and the supercritical fluid can be regenerated to provide an economic, efficient process.

55 Claims, 5 Drawing Sheets

METHOD AND APPARATUS FOR DISSOCIATING METALS FROM METAL COMPOUNDS EXTRACTED INTO SUPERCRITICAL FLUIDS

CROSS REFERENCE TO RELATED APPLICATIONS

This application claims priority from U.S. Provisional Application No. 60/056,749 filed on Aug. 20, 1997, and No. 60/062,140 filed on Oct. 3, 1997, which are incorporated herein by reference.

ACKNOWLEDGEMENT OF GOVERNMENTAL SUPPORT

The present invention was funded in part by the United States Department of Energy under Subcontract CC-S-588193 under Subcontract C95-175002 under contract DE-AC07-94ID13223; the United States government has certain rights in this invention.

FIELD OF THE INVENTION

The present invention concerns a method and apparatus for dissociating metals or metalloids from metal or metalloid compounds which are included (typically dissolved or suspended) in a supercritical fluid. The dissociation forms substantially uniform fine particles of metals, metalloids, metal oxides or metalloid oxides, and also regenerates ligands for reuse from compounds comprising metal- or metalloid-ligand complexes.

BACKGROUND OF THE INVENTION

Solvent extraction is a chemical process by which two or more immiscible fluids, or a fluid and a solid, are mixed to transfer chemicals dissolved or suspended in one fluid or solid into another fluid. Metal and metalloid compounds can be separated from aqueous and solid media by extraction with appropriate solvents. This extraction procedure usually is, however, time and labor intensive. Furthermore, conventional solvent extraction often involves the use of toxic organic compounds, creating environmental problems in connection with the handling and disposal of spent solvent.

Recently, supercritical fluid extraction has become an attractive alternative to conventional solvent extraction for the recovery of metals and metalloids from liquid and solid media. For example, U.S. Pat. No. 5,356,538 to Wai et al., incorporated herein by reference, discloses a method for extracting metal and metalloid compounds from a solid or liquid material by exposing the material to a supercritical fluid containing a chelating agent. In particular, it teaches extracting metal ions from media using supercritical carbon dioxide and dithiocarbamate ligands. Other patent applications by Wal et al., describing different aspects of supercritical fluid extraction, also are incorporated herein by reference, including: FLUID EXTRACTION, application Ser. No. 08/253,000, filed Jun. 2, 1994, FLUID EXTRACTION, application Ser. No. 08/458,759, filed Jun. 2, 1995; EXTRACTING METALS DIRECTLY FROM METAL OXIDES, filed Nov. 3 1995, now U.S. Pat. No. 5,606,724; and FLUID EXTRACTION, application Ser. No. 08/692,894, filed Jul. 26, 1996.

β-diketones, dithiocarbamates, trialkyl- and triarylphosphates and crown ethers have been used in the chelation and supercritical fluid extraction of metal compounds. Once the chelating agent, or ligand, has coupled to the metal, the resulting material is referred to as a metal-ligand complex.

In many industrial processes, it is subsequently necessary to remove the metal-ligand complex from the supercritical fluid. Wai et al.'s U.S. Pat. No. 5,356,538 teaches removing the metal-ligand complex from the supercritical fluid by reducing the pressure, which results in the expansion and dissipation of the supercritical fluid and the deposition of the metal-ligand complex.

Although Wai's method-is an advance in extraction technology, one drawback of Wai's method is that an intact metal-ligand complex is recovered from the supercritical fluid. Wai et al.'s United States Patent Application entitled METHOD AND APPARATUS FOR BACK-EXTRACTING METAL CHELATES, application Ser. No. 08/692,894, filed Jul. 26, 1996, and incorporated herein by reference, teaches a method for separating the metal from the metal-ligand complex after extraction. This method involves back extraction of the supercritical fluid with an acidic solution. The metal is released from the complex into the acidic solution while the ligand remains in the supercritical fluid. While this method is useful when applied to industrial processes that require ligand recycling, the method uses caustic acid, a potentially harmful and environmentally toxic material. Furthermore, it is necessary to go through additional steps to separate the metal from the acid solution.

A method for forming fine particles using supercritical fluids has been described in U.S. Pat. No. 5,639,441 to Sievers et al (Sievers). Sievers discloses a method and apparatus for forming particles of a desired substance. Sievers' method involves dissolving the substance in a fluid, particularly water, to form a solution, and then mixing the solution with a supercritical fluid to form an immiscible system. The pressure is then reduced, typically quite quickly, such as by venting the system to atmospheric pressure as a spray. This creates an airborne dispersion or aerosol and forms fine particles.

A method to deposit films of a desired material from a supercritical fluid by reducing the pressure of the supercritical fluid has been described. U.S. Pat. No. 4,970,093 to Sievers et al. teaches a method for producing a film of a desired material by dissolving the desired material or a precursor into a supercritical fluid, rapidly expanding the supercritical solution, and then inducing a chemical reaction in the resulting vapor. This method therefore involves a chemical reaction that occurs after the supercritical fluid has expanded and vaporized.

It also is known that some metal-ligand complexes, such as copper-ligand complexes, can be dissociated by the addition of hydrogen in the presence of an organic solvent, such as kerosene. This reaction is an alternate means to dissociate the metal-ligand complex into its metal and ligand components. This process, however, has several disadvantages, including: (1) significant ligand degradation at the high temperatures required for the reaction to occur; and (2) the low solubility of hydrogen in organic solvents.

SUMMARY OF THE INVENTION

The present invention provides a method for dissociating metals and/or metalloids from metal or metalloid compounds included in a supercritical fluid. Dissociation typically is induced by changing the oxidation state of the metal or metalloid of the compound and/or heating the metal or metalloid compounds. Once the metal or metalloid compound is dissociated, the resulting metal, metalloid, metal-oxide and/or metalloid-oxide products are insoluble in the supercritical fluid. As a result. metal, metalloid, metal-oxide and/or metalloid-oxide particles form.

Under the appropriate conditions, particles formed by the present method are substantially uniform in size. The size of the particles is determined by the conditions used to induce the dissociation reaction. The extraction/dissociation process is an efficient, cost-effective method for dissociating metals and/or metalloids from metal or metalloid compounds and producing substantially uniform fine metal, metalloid, metal-oxide or metalloid-oxide particles.

Metal and/or metalloid compounds that can be extracted from media using supercritical fluid extraction and then dissociated by the present invention include those that can be dissociated by reduction or oxidation, and/or heating. In a preferred embodiment, the metal of the metal compounds is copper and the supercritical fluid is supercritical carbon dioxide.

It is an object of this invention to provide a method for extracting metal and/or metalloid compounds from media and dissociating metals and/or metalloids from such compounds using methods that are environmentally innocuous and which efficiently separate the metal and/or metalloid from the other materials combined during the extraction procedure.

Another object of this invention is to produce fine, substantially uniform, preferably crystalline metal and/or metalloid particles that are free from the other components of the extraction process.

Still another object of this invention is to provide a method for dissociating metals and/or metalloids from metal and/or metalloid complexes to produce fine, substantially uniform, preferably crystalline metal and/or metalloid particles that are free from the other components of the extraction process, and to obtain ligands dissociated from the metal and/or metalloids in a form suitable for reuse for the formation of metal and/or metalloid ligand complexes.

DETAILED DESCRIPTION OF SEVERAL PREFERRED EMBODIMENTS

I. General Discussion of the Invention

Figure 1:
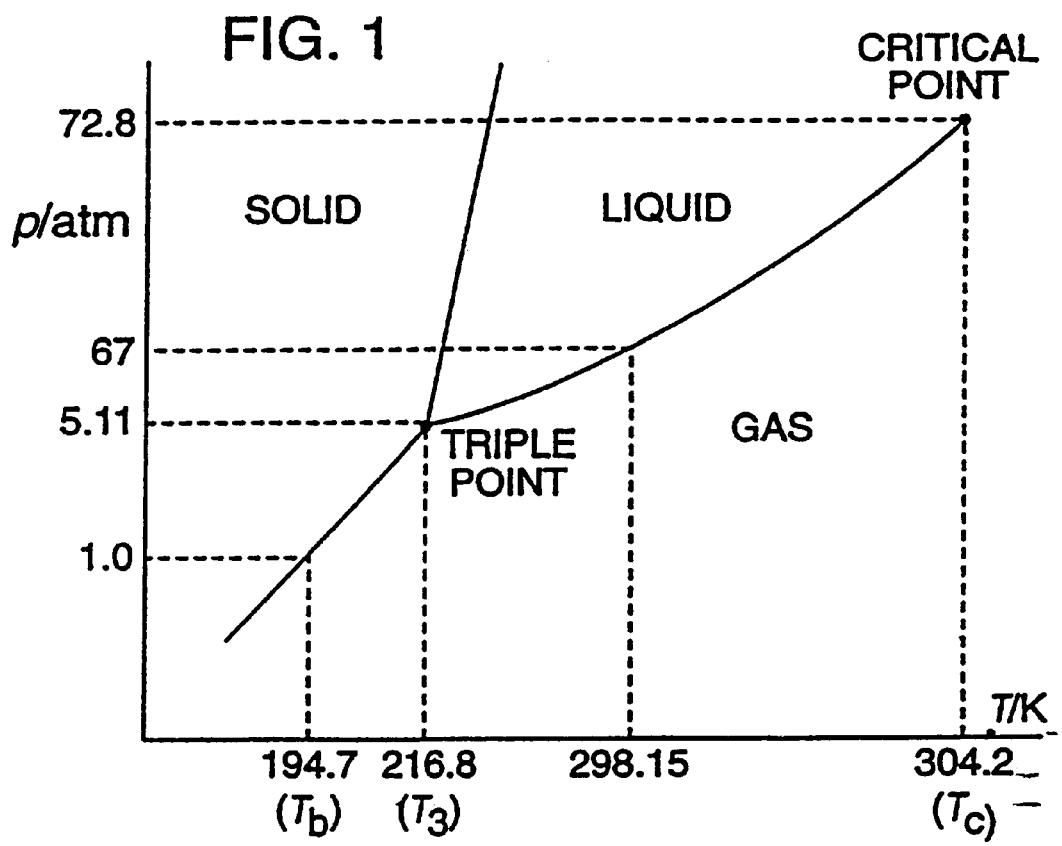
FIG. 1 is a carbon dioxide phase diagram.

The following paragraphs discuss various aspects of the present invention, including: a discussion of metals and metalloids most likely to be involved in the practice of the present invention; the selection of supercritical fluids and ligands most likely useful for practicing the invention; the extraction of metal and metalloid compounds using supercritical fluid extraction; and treating metal and metalloid compounds included in the supercritical fluid to dissociate the metal and metalloids from the substrate compounds. Working examples also are provided to illustrate several specific embodiments of the method.

Metals and metalloids may be dissociated from metal and/or metalloid compounds using chemical reactions, particularly reduction or oxidation reactions, and/or heating. The reduction or oxidation, and/or heating, occurs in the supercritical fluid, releasing metal, metalloid, metal-oxide and/or metalloid-oxide particles which are not significantly soluble in the supercritical fluid. Subsequent removal of the supercritical fluid by reducing the pressure, or by other means, allows for facile collection of substantially uniform, fine metal, metalloid, metal-oxide and/or metalloid-oxide particles free of organic solvents.

II. Metal and Metalloid Compounds

The present invention is suitable for dissociating many different metals and metalloids from many different types of materials comprising the metals or metalloids, all such materials being collectively referred to herein as "metal compounds." Metal compounds include, but are not limited to: coordination compounds; chelate compounds; other complexes having metals and/or metalloids coupled to ligands; organometallics; metal and metalloid halides; etc. The invention is particularly useful for forming metal- and/or metalloid-ligand complexes, extracting the complexes into a supercritical fluid, and then dissociating the metals and/or metalloids from the complexes in the supercritical fluid.

"Metal compounds" also can be defined for purposes of the present invention with respect to the desired result. That is, "metal compounds" can be defined with respect to whether metal or metalloid particles can be produced from such compounds by extraction into supercritical fluids followed by dissociating metals or metalloids from these compounds by changing the oxidation state of the metal or metalloid, and/or by heating the compounds.

A. Metals

A metal generally is any element that forms positive ions in solutions and produces oxides that form hydroxides, rather than acids, with water. Metals include alkali metals, alkali-earth metals, transition metals, and metalloids. An alkali metal is any element of group Ia in the periodic table: lithium, sodium, potassium, rubidium, cesium and francium. Alkali-earth metals include barium, calcium, strontium and magnesium. Transition metals are any of a group of metals including elements 21 to 29 (scandium through copper), 39 through 47 (yttrium through silver), 57 through 79 (lanthanum through gold), and all known elements from 89 (actinium) on.

Metalloids are elements having both metallic and nonmetallic properties. Examples of metalloids include arsenic, boron, silicon, germanium, antimony, polonium, selenium and tellurium.

B. Coordination Compounds

Coordination compounds generally are compounds formed by the union of a metal, particularly metal ions, with a nonmetallic ion or molecule called a ligand or complexing agent (typically referred to herein as a ligand). The ligand may be charged compounds, e.g. a halogen ion such as $Cl^-$, or a molecule, such as water or ammonia. Ligands typically have electron pairs that can be donated to or shared with metals, particularly where the metals are ionized. The metals act as Lewis acids (electron acceptors), and the ligands or complexing agents act as Lewis bases (electron donors). The nature of the bond between the metal and the ligands typically is neither covalent nor electrostatic, but more likely intermediate between the two.

Chelates refer to coordination compounds in which a central metal atom, typically a metal ion, is attached by coordinate links to two or more nonmetal atoms in the same ligand. Ligands offering two groups for attachment to the metal or metalloid are termed bidentate, three groups tridentate, etc. A nonexhaustive list of specific ligands considered particularly useful for practicing the present invention is provided below.

C. Organometallics

As used herein, "organometallic" is defined to mean an organic compound comprised of a metal attached directly to a carbon atom. Examples, without limitation, of organometallic compounds include: diethylzinc or diethylnickel; Grignard compounds, such as methyl magnesium iodide; metallic alkyls, such as butyllithium, tetraethyllead, triethyl aluminum, tetrabutyl titanate, and sodium methylate; phthalocyanines, such as copper phthalocyanines; and metallocenes.

D. Metal Halides

Metal halides also can serve as precursors for the dissociation process of the present invention. Examples of such halides include, without limitation, tungsten hexafluoride ($WF_6$) and titanium tetrachloride ($TiCl_4$).

III. Ligands

A partial list of ligands useful for chelating metals to render them soluble or suspendable in supercritical fluids is provided by Table I and in the discussion subsequent to Table I. The list is for illustration only. Other chelating agents, now known or hereafter discovered that are useful for forming metal chelates, also may be used.

TABLE I

COMMONLY USED METAL CHELATING AGENTS

Oxygen Donating Chelating Agents

Cupferron
Chloroanillic acid and related reagents
β-diketones and related reagents
N-Benzoyl-N-phenylhydroxylamine and related reagents
Macrocyclic compounds
Nitrogen Donating Chelating Agents α-dioximines
Diaminobenzidine and related reagents
Porphyrines and related reagents
Oxygen and Nitrogen Donating Chelating Agents 8-Hydroxyquinoline
Nitrosonapthols and nitrosophenols
EDTA and other complexionates
Diphenylcarbazide and diphenylcarbazone
Azoazoxy BN
Sulfur or Phosphorus Donating Chelating Agents Sodium diethlydithiocarbamate and related reagents
Dithizone and related reagents
Bismuthiol II
Thiothenoyltrifluoracetone
Thioxine
Thiophosphinic acids
Phosphine Sulfides
Phosphorothioic acids
Tributylphoshpate and related reagents Without limiting the present invention, examples of particularly suitable ligands for practicing the method of the present invention include β-diketones, halogenated β-diketones, trialkylphosphine oxides, triaryiphosphine oxides, alkylarylphosphine oxides, carboxylic acids, halogenated carboxylic acids, trialkylphosphates, triarylphosphates, alkylarylphosphates, crown ethers, halogenated crown ethers, dithiocarbamates, phosphine sulfides, phosphorothioic acids, thiophosphinic acids and mixtures thereof.

A. β-diketones

β-diketones used to practice the present invention generally satisfy the following Formula 1:

FORMULA 1

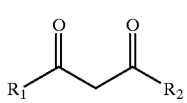

wherein $R_1$ and $R_2$ typically are independently selected from the group consisting of lower alkyl groups, halogenated lower alkyl groups, and thenoyl groups. As used herein, "lower alkyl" refers to compounds having from about one (1) to about ten (10) carbon atoms, and includes both straight-chain and branched-chain compounds as well as all isomers and stereoisomers. As further used herein, a "halogenated lower alkyl group," such as a fluorinated ethyl group, means that at least one of the hydrogen atoms present on the alkyl group is replaced with a halogen atom. A "halogenated lower alkyl group" also can refer to compounds wherein all, or any number, of the hydrogen atoms have been replaced with halogens.

More specifically, $R_1$ and $R_2$ of Formula 1 are independently selected from the group consisting of methyl, fluorinated methyl, trifluoromethyl, ethyl, fluorinated ethyl, pentafluoroethyl, propyl, fluorinated propyl, heptafluoropropyl, butyl, fluorinated butyl and nonafluorobutyl. Specific examples of suitable β-diketones include, without limitation, acetylacetone, dibutyldiacetate, trifluoroacetylacetone, hexafluoroacetylacetone, thenoyltrifluoroacetylacetone and heptafluorobutanoylpivaroylmethane. Especially preferred β-diketones include hexafluoroacetylacetone and dibutyldiacetate.

In preferred embodiments, halogenated ligands are used to enhance the supercritical fluid solubility of the metal-ligand complexes formed from such ligands. In especially preferred embodiments, the ligand is fluorinated. The solubilities of some halogenated metal-ligand complexes in supercritical carbon dioxide, and in particular the fluorinated metal-ligand complexes, are enhanced by two to three orders of magnitude relative to the corresponding non-halogenated metal-ligand complexes. For illustrative purposes only, and without limiting the present invention, a suitable fluorinated ligand is shown below.

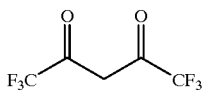

Hexafluoroacetylacetone

B. Phosphinic Acids

The phosphinic acid ligands generally considered useful for practicing the method of the present invention satisfy the following Formula 2:

FORMULA 2

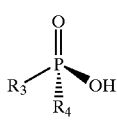

wherein $R_3$ and $R_4$ are independently selected from the group consisting of lower alkyl, halogenated lower alkyl, aryl, halogenated aryl and thenoyl C. Carboxylic Acids The carboxylic acids generally considered useful for practicing the method of the present invention satisfy the following Formula 3:

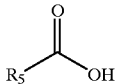

FORMULA 3 wherein $R_5$ generally is selected from the group consisting of lower alkyl, halogenated lower alkyl, aryls, halogenated aryls, halogenated aryls and thenoyl groups.

D. Phosphates

The phosphates generally considered useful for practicing the method of the present invention satisfy the following Formula 4:

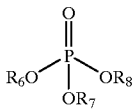

FORMULA 4 wherein $R_6$–$R_8$ are independently selected from the group consisting of lower alkyl groups and aryl groups.

E. Crown Ethers

Crown ethers generally considered useful for practicing the method of the present invention satisfy the following Formula 5:

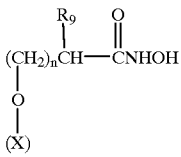

FORMULA 5 wherein X is a dibenzo crown ether of the formula dibenzo [13+3 m]-crown-[4+m] ether, and m is an integer of from 0 to about 5, n is an integer from 0 to 6, and $R_9$ is H or a lipophilic hydrocarbyl group having from 1 to about 18 carbon atoms and is selected from the group consisting of alkyl, cycloalkyl, alkenyl and aryl groups.

In more preferred embodiments, the crown ether is represented by Formula 6:

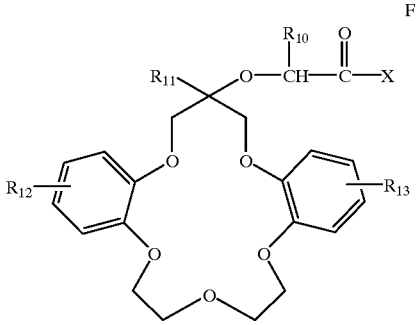

FORMULA 6 wherein X is OH or NHOH; $R_{10}$ is alkyl, halogenated alkyl, phenyl or halogenated phenyl; $R_{11}$ is alkyl, halogenated alkyl; $R_{12}$ is H or a halogen; and $R_{13}$ is H or a halogen.

F. Dithiocarbamates

Dithiocarbamates generally considered useful for practicing the method of the present invention satisfy the following Formula 7:

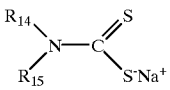

FORMULA 7 wherein $R_{14}$ and $R_{15}$ are alkyl or aromatic groups, and wherein $R_{14}$ and $R_{15}$ also may include one or more halogen atoms.

IV. Supercritical Fluids

Suitable fluids and/or supercritical fluids for use in the present invention include, without limitation, carbon dioxide, nitrogen, nitrous oxide, methane, ethylene, propane and propylene. Carbon dioxide is a particularly preferred fluid for both subcritical and supercritical fluid extractions because of its moderate chemical constants ($T_C$=31° C., $P_C$73 atm) and its inertness (i.e., it is non-explosive and thoroughly safe for extractions, even extractions performed at supercritical conditions). Carbon dioxide also is a preferred solvent because it is abundantly available and relatively inexpensive.

FIG. 1 is a phase diagram for carbon dioxide. FIG. 1 shows the conditions necessary to produce either subcritical liquid carbon dioxide or supercritical carbon dioxide. All conditions above the triple point ($T_P$) produce a supercritical carbon dioxide fluid solvent, and most such conditions are effective for practicing the present invention.

Alternatively, liquid $CO_2$ may be suitable for practicing the method of the present invention. At room temperature carbon dioxide becomes a liquid above 5.1 atm. Depending on the pressure, liquid carbon dioxide has a density comparable or slightly greater than supercritical carbon dioxide, thus the salvation power of liquid carbon dioxide is comparable to that of supercritical carbon dioxide. This means liquid carbon dioxide also should be able to dissolve or suspend, preferably dissolve, the metal and metalloid compounds described above. However, liquid carbon dioxide does not have the "gas-like" properties of supercritical carbon dioxide. Therefore, liquid carbon dioxide has a large viscosity, small diffusivity, and consequently poor penetration power compared with the supercritical carbon dioxide.

The fluid solvents of the present invention may be used either individually or in combinations, as mixed fluids or supercritical fluid solvents. Examples of suitable fluids, and their critical temperature and pressure, are provided by Table II:

TABLE II

PHYSICAL PARAMETERS OF SELECTED SUPERCRITICAL FLUIDS*

| Fluid | Molecular Formula | $T_c$(° C.) | $p_c$(atm) | $\rho_c$(g/mL) | $\rho 400_{atm}$** |
|---|---|---|---|---|---|
| Carbon dioxide | $CO_2$ | 31.1 | 72.9 | 0.47 | 0.96 |
| Nitrous oxide | $N_2O$ | 36.5 | 71.7 | 0.45 | 0.94 |
| Ammonia | $NH_3$ | 132.5 | 112.5 | 0.24 | 0.40 |
| η-Pentane | $C_5H_{12}$ | 196.6 | 33.3 | 0.23 | 0.51 |
| η-Butane | $C_4H_{10}$ | 152.0 | 37.5 | 0.23 | 0.50 |
| η-Propane | $C_3H_6$ | 96.8 | 42.0 | 0.22 | — |

TABLE II-continued

PHYSICAL PARAMETERS OF SELECTED SUPERCRITICAL FLUIDS*

| Fluid | Molecular Formula | $T_c$(° C.) | $p_c$(atm) | $\rho_c$(g/mL) | $\rho 400_{atm}$** |
|---|---|---|---|---|---|
| Sulfur hexafluoride | $SF_6$ | 45.5 | 37.1 | 0.74 | 1.61 |
| Xenon | Xe | 16.6 | 58.4 | 1.10 | 2.30 |
| Dichlorodifluoromethane | $CCl_2F_2$ | 111.8 | 40.7 | 0.52 | 1.12 |
| Trifluoromethane | $CHF_3$ | 25.9 | 46.9 | 0.52 | — |
| Methanol | $CH_3OH$ | 240.5 | 78.9 | 0.27 | — |
| Ethanol | $C_2H_5OH$ | 243.4 | 63.0 | 0.28 | — |
| Isopropanol | $C_3H_7OH$ | 235.3 | 47.0 | 0.27 | — |
| Diethyl ether | $(C_2H_5)_2O$ | 193.6 | 36.3 | 0.27 | — |
| Water | $H_2O$ | 374.1 | 218.3 | | |

*data from Matheson Gas Data Book (1980) and CRC Handbook of Chemistry and Physics (CRC Press, Boca Raton, Florida 1984).
**$T_r$ = 1.03

In addition, a modifier may be added to the fluid, including supercritical fluids, to improve the solvent characteristics thereof. The most useful modifiers are water and the low to medium boiling point alcohols and esters, such as the lower alkyl alcohols and esters. Typical modifiers may be selected from the group consisting of water, methanol, ethanol, ethyl acetate and the like. The modifiers typically are added to the fluids at proportions of between about 0.1% and 20.0% by weight. The modifiers contemplated for use herein are most typically not supercritical fluids at the disclosed operating conditions. Rather, the modifiers are simply dissolved in the fluid solvents, including the supercritical fluid solvents, to improve the solvent properties of such fluids.

In one embodiment, the chosen enhancer is combined with a supercritical fluid at the described proportions prior to or simultaneously with feeding the supercritical fluid to the extraction vessel or simultaneous therewith. Alternatively, the supercritical fluid is fed to the extraction vessel without the enhancer. The enhancer is then introduced into the extraction vessel and combined with the supercritical fluid.

V. Formation of Metal-Ligand Complexes During Supercritical Fluid Extraction As discussed above, the present invention involves the formation of metal compounds. In one embodiment, metal-ligand complexes are formed during the extraction step. In more particular embodiments of this method for forming metal-ligand complexes, a system is provided for treating metals. The metals are placed in a container through which the fluid, or supercritical fluid, and ligands are passed. The ligands combine with the metal to form metal-ligand complexes that are soluble or suspendable in the fluid or supercritical fluid. The fluid or supercritical fluid including the metal-ligand complexes is then removed from the container.

Fluid or supercritical fluid can be flowed continuously through the material containing the metals, or exposed to the material in a discontinuous batch process. In one embodiment, a supercritical fluid is flowed through a ligand to dissolve the ligand in the fluid before exposing the metal-containing material to the fluid. Preferably, the supercritical fluid includes at least one ligand and a solvent modifier.

VI. Treating Metal Compounds in a Supercritical Fluid

Treating metal compounds in a supercritical fluid to dissociate or disproportionate the compounds is performed by initiating chemical reactions in the supercritical fluid, particularly reduction and oxidation reactions. By initiating these chemical reactions, the metal compounds can be dissociated or disproportionated in the supercritical fluid. In a preferred embodiment, the volume of the supercritical fluid is maintained substantially constant during the chemical reaction and subsequent particle formation.

A. Heating

When certain metal compounds are heated or otherwise exposed to thermal energy in the presence of oxygen or other oxidizing agents, the metal is oxidized, and the compound dissociates to form metals or metal oxides and the ligands.

Certain redox reactions become substantially more efficient when the temperature is raised above ambient. As a result, it may be beneficial to heat systems to induce dissociation.

Thus, in one embodiment, the metal compounds included in the supercritical fluid can be heated to induce dissociation. In another embodiment, the fluid is applied to a substrate. In a preferred embodiment, the substrate is heated to induce particle formation on the substrate. Without limiting the invention, one example of a suitable substrate is a silicon wafer. In another preferred embodiment, the pressure of the supercritical fluid is reduced after the heating process, thus dissipating the supercritical fluid and depositing substantially pure metal or metal oxide particles on the substrate.

B. Changing the Oxidation State of a Metal

The oxidation state of the metal of the metal compound can be changed using a reducing agent or an oxidizing agent. Reduction of chemical compounds, such as metals, occurs when one or more electrons are donated to such compounds. Oxidation is the reverse of reduction; that is, the removal of one or more electrons from a chemical compound. Thus, reducing agents and oxidizing agents are chemical agents that either donate (reducing agents) or accept (oxidizing agents) an electron from an element or molecule. For example, in the reaction:

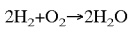

$$2H_2 + O_2 \rightarrow 2H_2O$$

$H_2$ is the reducing agent because each $H_2$ transfers one electron to O. Similarly, O is an oxidizing agent because each O removes an electron from $H_2$.

The oxidation state of an element can be determined by following several rules.

1. In uncombined or free elements, each atom is assigned an oxidation state of 0.
2. In simple ions (i.e. charged compounds which contain but one atom), the oxidation state is equal to the charge of the ion.
3. In compounds containing oxygen, the oxidation state of each oxygen atom is generally −2.
4. In compounds containing hydrogen, the oxidation state of hydrogen is +1.
5. All oxidation states must be consistent with the conservation of charge.

In the chemical reaction above, the oxidation states of both H and O were changed. The oxidation state of H increased from 0 to +1, and the oxidation state of O was reduced to −2.

Without limitation, an example of a suitable oxidizing agent for practicing the present invention is oxygen. Hydrogen is an example of a suitable reducing agent. A preferred embodiment of the present method involves dissolving a reducing or oxidizing gas, such as hydrogen or oxygen, through the supercritical fluid including the metal compound. Thus, the reducing or oxidizing agents can be flowed through the supercritical fluid including the metal compound. Alternatively, the metal compounds may be exposed to the reducing or oxidizing agent in the fluid in a discontinuous batch process. In still another embodiment, the supercritical fluid itself can act as a reducing or oxidizing agent.

C. Recycling of Ligands

With particular reference to metal-ligand complexes, after the metal-ligand complex is dissociated, the ligand can be recycled to form new metal-ligand complexes. Recycling ligands can be useful because it reduces operating costs by reusing ligands rather than discarding them after a single use.

VII. Metal and Metal Oxide Particles

When some metal compounds in a supercritical fluid are dissociated, the metal or metal oxide reaction products formed are insoluble in the supercritical fluid and metal or metal oxide particles are formed. Different size particles can be formed by changing the reaction conditions. To alter the size of the particles, conditions such as temperature and pressure, for example, may be changed. Without limiting the present invention to one theory of operation, a currently preferred theory is that these conditions affect crystal nucleation and the resultant crystal growth. Thus, once the reaction conditions for producing particles are determined, the particle size can be predetermined by appropriate variation of such reaction conditions. The absolute range of possible particle sizes currently is not known.

The time scale of particle precipitation can effect the size uniformity and absolute size of the particles produced. Without limiting the invention, it currently is believed that a very short reaction time, for instance less than a few seconds, is insufficient to produce uniform, discrete crystalline particles. The reaction conditions to which the supercritical fluid, metal compound or compound, and any reducing or oxidizing agents are exposed are under constant control by the reaction vessel. Therefore, the conditions desired for a particular particle formation reaction is maintained until, for instance, removal of the supercritical fluid or removal of the heat source occurs.

There likely is no maximum time period for particle formation. The maximum reaction time is more likely determined for a commercial process by issues of efficiency and expense. A typical time range for producing discrete, substantially uniform particles is from about 3 seconds to about 2 hours. A preferred time range for particle formation according to the method of the present invention is from about 15 minutes to about 45 minutes, The particles produced by this process are "substantially uniform". "Substantially uniform" particles have a low standard deviation from the mean diameter. In preferred embodiments, the metal or metal oxide particles are well crystallized.

VIII. Apparatus

Figure 2:
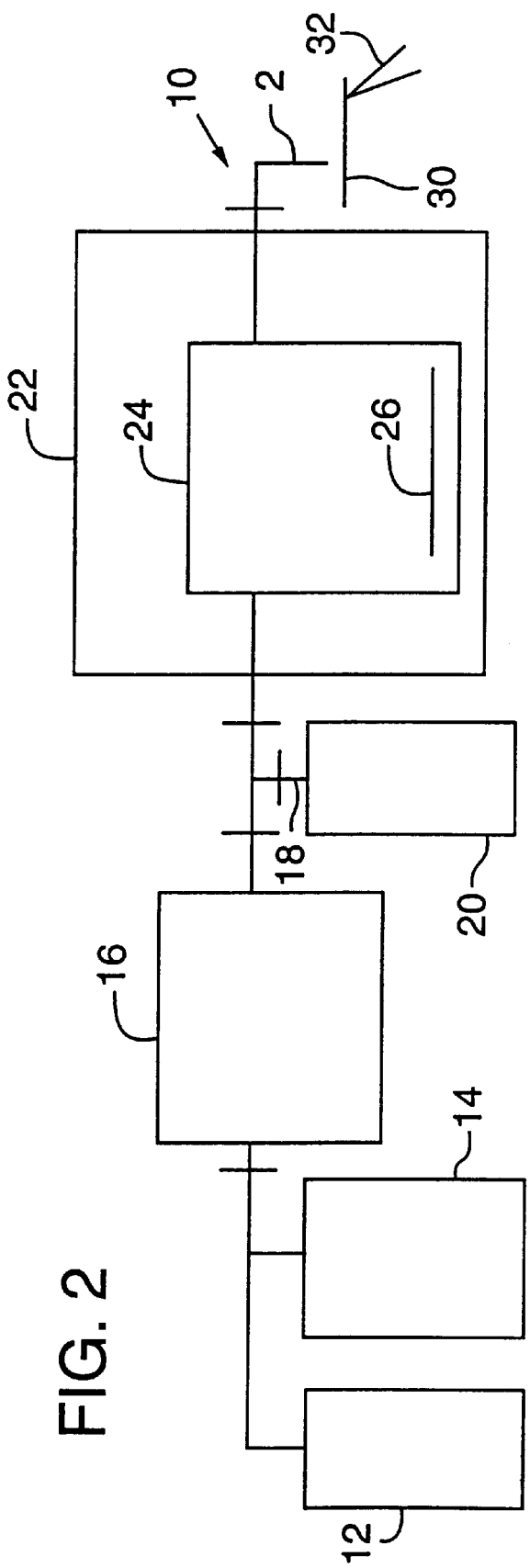
FIG. 2 is a schematic drawing illustrating one embodiment of a system for dissociating metal-ligand complexes in accordance with the present invention.

FIG. 2 discloses an apparatus 10 suitable for use in performing the methods of the present invention. With reference to FIG. 2, apparatus 10 includes a source 12 of supercritical fluid, a syringe pump 14, a vessel 16 containing metal and/or metalloid compounds, a T-valve 18, a source 20 of reducing or oxidizing agent, an oven 22, a reaction vessel 24 and a substrate 26.

Apparatus 10 is used in the present invention as follows. The syringe pump 14 is used to pump the supercritical fluid from the source 12 past the vessel 16 which contains metal compounds. T-valve 18 is used to control the formation of a mixture comprising a reducing or oxidizing agent, if any such agent is used, from the source 20 and the supercritical fluid including the metal and/or metalloid compounds. Once the mixture enters the reaction vessel 24, the temperature of the mixture can be controlled by varying the temperature of the oven 22. Raising the temperature, for example, can induce the desired chemical reaction and the resulting metal particles can be collected on the substrate 26. The pressure can subsequently be reduced using a restrictor 28 to remove the supercritical fluid.

In a different embodiment, the oven 22 is not used to heat the reaction but instead the supercritical fluid including the metal compound is released from the reaction vessel 24 through the restrictor 28 and onto a substrate 30. Substrate 30 can be heated, and a currently preferred method for heating substrate 30 is resistively heating by current from electrodes 32.

Figure 3:
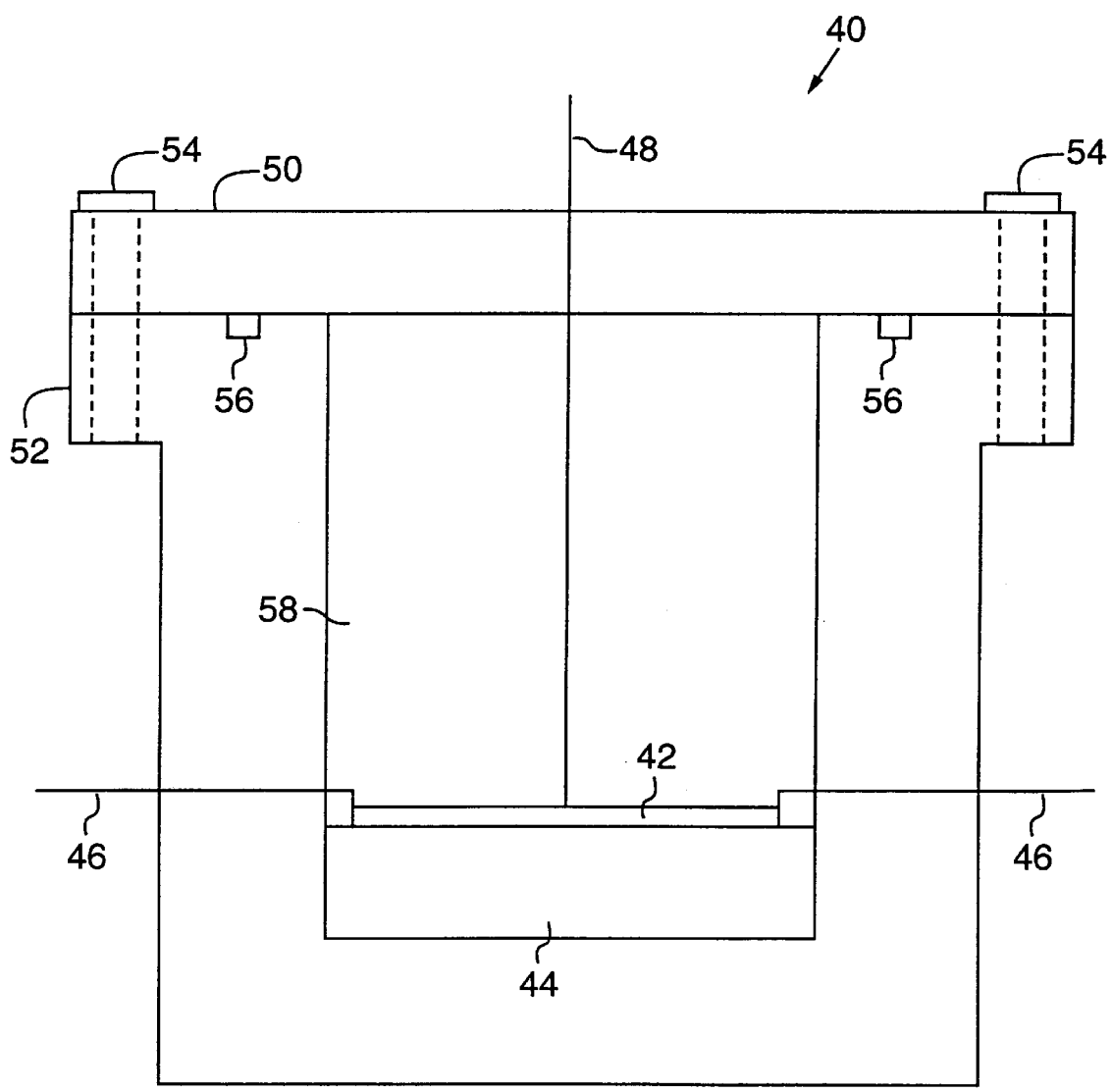
FIG. 3 is a schematic drawing illustrating one embodiment of a reaction vessel used in working embodiments of the method of the present invention.

In another embodiment and with reference to FIG. 3, the reaction vessel 40 contains a substrate 42 on top of a thermal insulator 44. The substrate can be heated resistively by applying a current from electrodes 46. A thermocouple 48 is inserted into the reaction vessel 40 to monitor temperature. The lid 50 of the reaction vessel 40 can be fastened to the vessel base 52 by fasteners, such as bolts 54. The lid also typically is sealed using gaskets, such as teflon gaskets 56 When the supercritical fluid is placed in the interior 58 of the reaction vessel 40, the substrate can be heated, thereby inducing the chemical reaction and forming metal particles on the heated substrate 42.

IX. Examples of Dissociating and Disproportionating Metal Compounds to Produce Particles The following examples are provided solely to illustrate certain embodiments of the invention. The invention should not be limited to the particular embodiments discussed in the examples. For instance, one example illustrates the use of fluorinated ligands, but the invention should not be limited to using just fluorinated compounds. Non-fluorinated ligands, including other halogenated ligands, also perform satisfactorily.

EXAMPLE 1

This example describes the production of metal particles by dissociating a metal from a metal-ligand complex in a supercritical fluid by changing the oxidation state of the metal. More specifically, this example describes the reduction of copper di-hexafluoroacetylacetone [$Cu(HFA)_2$] by hydrogen in supercritical $CO_2$. The procedure was performed with a lab-built supercritical fluid reaction system as illustrated in FIG. 2. Liquid $CO_2$ was delivered to the reaction system using a 250 mL ISCO syringe pump. The supercritical fluid reactor consisted of a vessel for precursors, a T-valve for introducing hydrogen to the system, a reaction vessel placed in a temperature-controlled oven, and an outlet valve connected to a restrictor. A substrate was placed into the reaction vessel to collect the condensed metal particles produced in the supercritical phase. A restrictor (50–100 micron fused silica tubing) was used to control the pressure drop during depressurization of the system after reaction. The powders produced from these procedures were analyzed by a scanning electron microscope.

Copper di-hexafluoroacetylacetone, a fluorinated copper/β-diketone complex, has a high solubility in supercritical $CO_2$ (>0.1 mole fraction at 170° C. and 120 atm), In the presence of hydrogen gas at an elevated temperature, copper di-hexafluoroacetylacetone can be reduced to copper metal and hexafluoro-acetylacetone (HFA) in supercritical $CO_2$. Because HFA is very soluble in supercritical $CO_2$, it remains in the fluid phase while copper particles precipitate on the substrate.

Supercritical carbon dioxide at 1470 psi containing $H_2$ gas at 80 psi was placed in a 3.5 ml cell. 0.1780 g of copper di-hexafluoroacetylactone was dissolved therein.

Figure 4:
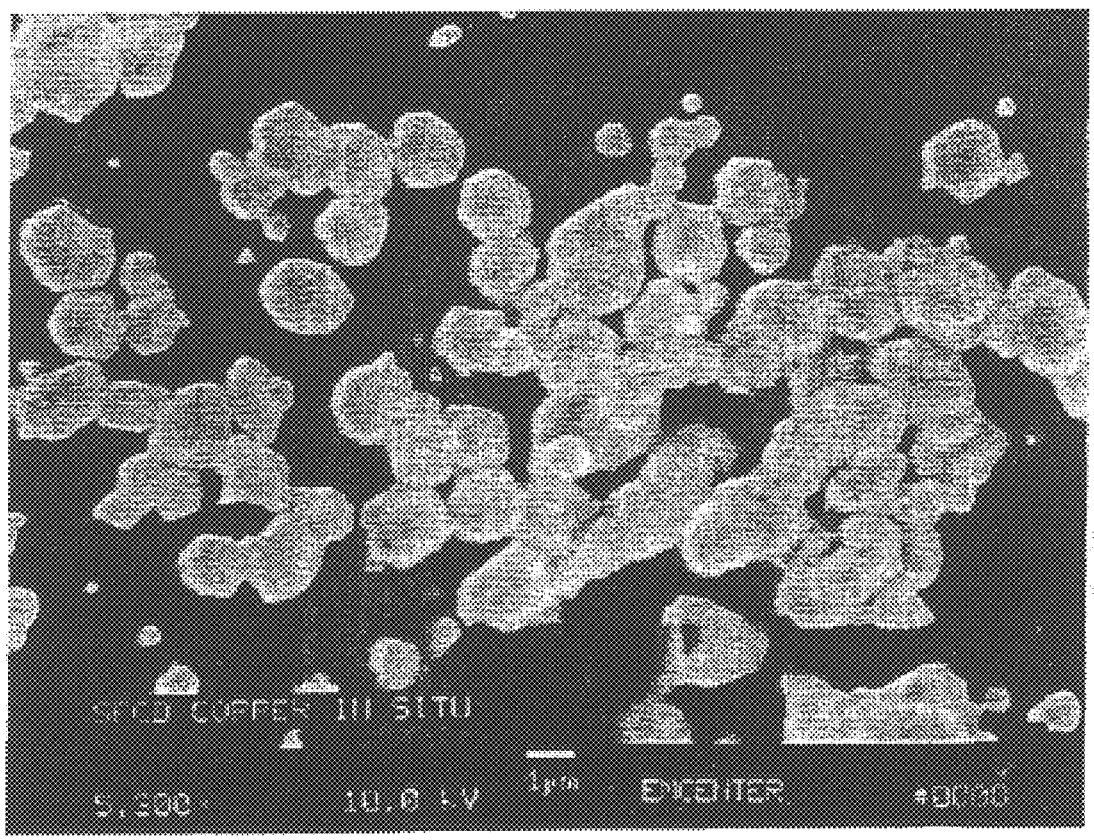
FIG. 4 is a scanning electron micrograph (SEM) of copper particles produced by reduction of copper hexafluoroacetylacetone in supercritical carbon dioxide according to the method of the present invention.

FIG. 4 shows the copper particles produced by the in situ reduction of $CU(HFA)_2$ in supercritical $CO_2$ at a temperature of about 265° C. for a period of about 30 minutes. Under these conditions, the reduction of copper takes place in several minutes. Below 250° C., the reduction process is not efficient. Faceted microcrystalline copper particles have been produced using this technique as shown in FIG. 4. An interesting observation is that the particle size is fairly uniform, as illustrated in FIG. 4, with an average diameter of about one micron.

Once the reduction reaction is complete, the HFA ligand dissociated from the copper in the supercritical $CO_2$ can be recycled to extract more metal, thus forming new metal-ligand complexes in the supercritical fluid. Alternatively, the ligand can be collected by removing the supercritical fluid carrying the ligand from the reaction. Then, by reducing the pressure, the $CO_2$ can be dissipated and the ligand can be collected. Furthermore, the reduced metal can be easily collected, free from solvent hydrocarbon impurities, by reducing the pressure.

The method of Example 1 also can be used to produce particles made of other metals, e.g. silver, gold or tungsten. For instance, if tungsten particles are desired, a metal-ligand complex comprising tungsten and a ligand should be used as starting materials.

EXAMPLE 2

When dibutyl tin diacetate (DBTDA) is heated under atmospheric pressure, it converts to $SnO_2$ at around 220° C. DBTDA is very soluble in supercritical $CO_2$.

Figure 5:
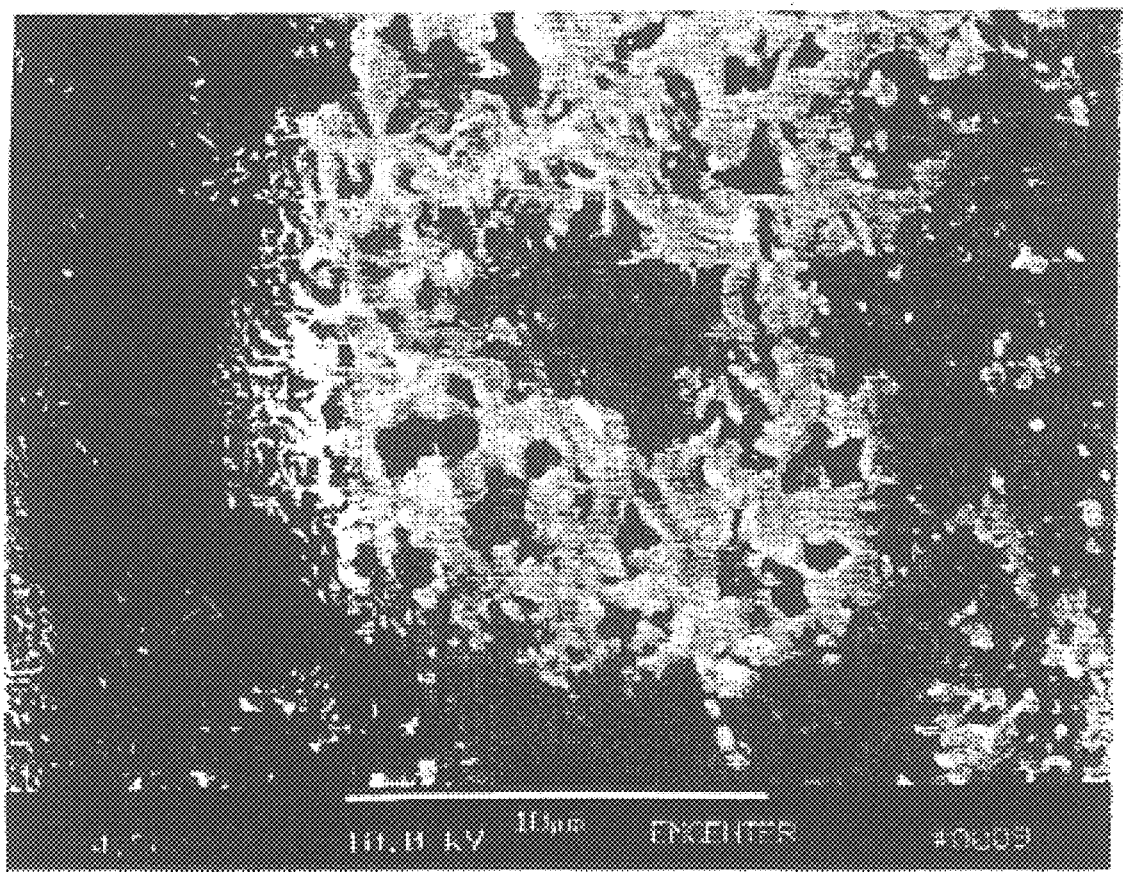
FIG. 5 is an SEM of tin oxide particles produced by spraying dibutyl tin diacetate onto a heated substrate according to the method of the present invention.

An experiment was performed by spraying a supercritical $CO_2$ fluid (200 atm, 50° C.) containing saturated DBTDA onto a heated substrate at 250° C. When supercritical $CO_2$ was sprayed onto the substrate, the temperature of the heated substrate dropped due to the high velocity of the expanding $CO_2$ gas. The particles precipitated on the substrate are amorphous as shown in FIG. 5. The amorphous particles illustrated in FIG. 5 are typical products for a procedure involving the rapid expansion (e.g. by spraying) of a supercritical fluid before or during a chemical reaction to form particles.

As described in Example 1, the procedure was performed with a lab-built supercritical fluid reaction system as shown in FIG. 2. Liquid $CO_2$ was delivered to the reaction system using a 250 mL ISCO syringe pump. The supercritical fluid reactor consisted of a vessel for precursors, a T-valve for introducing oxygen to the system, a reaction vessel placed in a temperature-controlled oven, and an outlet valve connected to a restrictor. A substrate was placed into the reaction vessel to collect the condensed metal or metal oxide particles produced in the supercritical phase. A restrictor (50–100 micron fused silica tubing) was used to control the pressure drop during depressurization of the system after reaction. The restrictor also was used as a device to spray dissolved DBTDA on a heated substrate to make $SnO_2$ powder. The DBTDA was dissolved in supercritical $CO_2$ at about 40° C. in the reactor and sprayed on a substrate heated to 250° C. The powders produced from these procedures were analyzed by a scanning electron microscope.

EXAMPLE 3

This example describes a method for producing metal particles by oxidizing, in a supercritical fluid, a metal-ligand complex. The method is substantially the same as described in Example 1, but involves substituting an oxidizing agent, such as oxygen, for hydrogen, and using the proper metal-ligand complex. The procedure would be performed with a lab-built supercritical fluid reaction system as illustrated in FIG. 2. Liquid $CO_2$ would be delivered to the reaction system using a 250 mL ISCO syringe pump. The supercritical fluid reactor would consist of a vessel for precursors, a T-valve for introducing oxygen to the system, a reaction vessel placed in a temperature-controlled oven, and an outlet valve connected to a restrictor. A substrate would be placed in the reaction vessel to collect the metal or metal oxide particles produced in the supercritical phase. A restrictor (50–100 micron fused silica tubing) would be used to control the pressure drop during depressurization of the system after reaction. The powders produced from these procedures would be analyzed by a scanning electron microscope.

In the presence of oxygen gas at an elevated temperature, dibutyltin diacetate can be converted to $SnO_2$ and dibutyl-diacetate in supercritical $CO_2$. Because dibutyldiacetate is very soluble in supercritical $CO_2$, it will remain in the fluid phase while the $SnO_2$ particles precipitate or are otherwise deposited onto the substrate. Pressurized air can be used as a source of oxygen. Supercritical carbon dioxide at 1470 psi containing air at 80 psi would be placed in a 3.5 ml cell and 0.1780 g of dibutyltin diacetate would be dissolved therein. The in situ pyrolysis of dibutyltin diacetate in supercritical $CO_2$ would be induced by raising the temperature, such as up to about 250° C., and maintaining this temperature for a period of time sufficient to achieve the desired reaction, such as for about 30 minutes. Under these conditions, the oxidation of tin will take place in several minutes. Below 250° C., the oxidation process may not be sufficiently efficient for a commercial process. Faceted microcrystalline $SnO_2$ particles would be produced using this technique.

Once the reaction is complete, the dibutyldiacetate ligand in the supercritical $CO_2$ can be recycled to extract more metal, thus forming new metal-ligand complexes in the supercritical fluid. Alternatively, the ligand can be collected by removing the supercritical fluid carrying the ligand from the reaction. Then, by reducing the pressure, the $CO_2$ can be dissipated and the ligand can be collected. Furthermore, the oxidized metal can be easily collected, free from solvent hydrocarbon impurities, by simple reducing the pressure of the supercritical phase.

The method of Example 3 also can be used to produce particles comprising other metals, e.g. titanium and tantalum. For instance, if titanium dioxide particles are desired, a metal-ligand complex that could be oxidized to dissociate into titanium dioxide and a ligand should be used.

EXAMPLE 4

This example describes a method for producing metal particles by reducing, in a supercritical fluid, an organometallic compound. The method is substantially the same as described in Example 1, but involves substituting an organometallic compound for the metal-ligand complex described in Example 1. The procedure would be performed with a lab-built supercritical fluid reaction system, such as that illustrated in FIG. 2. Liquid $CO_2$ would be delivered to the reaction system using a syringe pump. The supercritical fluid reactor would consist of a vessel for organometallic precursors, a T-valve for introducing hydrogen to the system, a reaction vessel placed in a temperature-controlled oven, and an outlet valve connected to a restrictor. A substrate would be placed in the reaction vessel to collect the metal or metalloid particles produced in the supercritical phase. A restrictor (50–100 micron fused silica tubing) would be used to control the pressure drop during depressurization of the system after reaction. The powders produced from these procedures would be analyzed by a scanning electron microscope.

In the presence of hydrogen gas, which can be introduced using the apparatus described above, the organometallic compound nickel cyclopentadiene $[Ni(C_5H_5)_2]$ can be reduced in supercritical $CO_2$ to Ni and cyclopentadiene. Particles of nickel metal precipitate, or are otherwise deposited, onto the substrate. The in situ reduction of nickel in supercritical $CO_2$ could be further induced by raising the temperature, such as to about 250° C., and maintaining this temperature for period sufficient to achieve formation of the desired particles, such as a period of about 30 minutes.

Once the reduction reaction is complete, the reduced metal can be easily collected, free from solvent hydrocarbon impurities, by simply reducing the pressure. Accordingly, the method described in this Example 4 also can be used to produce particles made of other metals or metalloids. Furthermore, it should be realized that the organometallic compound also might be subjected to oxidizing compounds if, for example, it is desired to produce oxidized metals, oxidized metalloids, metal oxides or metal oxides from organometallics.

EXAMPLE 5

This example describes a method for producing metal particles by reducing, in a supercritical fluid, a metal halide. The method is substantially the same as described in Example 1, but involves substituting a metal halide for the metal-ligand complex described in Example 1. The procedure would be performed with a lab-built supercritical fluid reaction system, such as that illustrated in FIG. 2. Liquid $CO_2$ would be delivered to the reaction system using a syringe pump. The supercritical fluid reactor would consist of a vessel for precursors, a T-valve for introducing hydrogen or oxygen to the system, a reaction vessel placed in a temperature-controlled oven, and an outlet valve connected to a restrictor. A substrate would be placed in the reaction vessel to collect the metal or metalloid particles produced in the supercritical phase. A restrictor (50–100 micron fused silica tubing) would be used to control the pressure drop during depressurization of the system after reaction. The powders produced from these procedures would be analyzed by a scanning electron microscope.

In the presence of hydrogen gas, which can be introduced using the apparatus described above, tungsten hexafluoride ($WF_6$) can be reduced to tungsten (W) and hydrogen fluoride (HF). Particles of tungsten metal precipitate, or are otherwise deposited, onto the substrate. The in situ reduction of W in supercritical $CO_2$ could be further facilitated by raising the reaction temperature, such as up to about 250° C., and maintaining this temperature for period sufficient to practice the process, such as a period of about 30 minutes.

Once the reduction reaction is complete, the reduced W metal can be easily collected, free from solvent hydrocarbon impurities, by simply reducing the pressure. Accordingly, the method described in this Example 5 also can be used to produce particles from other metal halides or metalloid halides.

Furthermore, it should be realized that the metal halide also might be subjected to oxidizing compounds if, for example, metal oxides are desired. For example, titanium tetrachloride ($TiCl_4$) can be oxidized, such as in the presence of water, to form titanium dioxide.

EXAMPLE 6

This example describes a method for producing metal particles by reducing, in a supercritical fluid, a metal carbonyl complex. The method is substantially the same as described in Example 1, but involves substituting a metal carbonyl complex for the metal-ligand complex described in Example 1. The procedure would be performed with a lab-built supercritical fluid reaction system, such as that illustrated in FIG. 2. Liquid $CO_2$ would be delivered to the reaction system using a syringe pump. The supercritical fluid reactor would consist of a vessel for precursors, a reaction vessel placed in a temperature-controlled oven, and an outlet valve connected to a restrictor. A substrate would be placed in the reaction vessel to collect the metal particles produced in the supercritical phase. A restrictor (50–100 micron fused silica tubing) would be used to control the pressure drop during depressurization of the system after reaction. The powders produced from these procedures would be analyzed by a scanning electron microscope.

Tungsten hexacarbonyl $[W(CO)_6]$ can be pyrolised to form tungsten metal. Subsequent to dissociation by pyrolysis, particles of tungsten metal precipitate, or are otherwise deposited, onto the substrate. The in situ dissociation of W in supercritical $CO_2$ is thus facilitated by raising the temperature to a sufficient pyrolytic temperature, and thereafter maintaining this temperature for period sufficient to produce tungsten metal.

Once the reduction reaction is complete, the W metal can be easily collected, free from solvent hydrocarbon impurities, by simply reducing the pressure. Accordingly, the method described in this Example 6 also can be used to produce particles from other metal-carbonyl complexes.

EXAMPLE 7

This example describes a method for producing metal particles by heating metal-ligand complexes that further include an alcohol ligand coupled to the metal or metalloid. In this system, a disproportionation reaction occurs (i.e., one in which a single compound serves as both an oxidizing and reducing agent). The disproportionation reaction would be performed with a lab-built supercritical fluid reaction system, such as that illustrated in FIG. 2. Liquid $CO_2$ would be delivered to the reaction system using a syringe pump. The supercritical fluid reactor would consist of a vessel for precursors, a reaction vessel placed in a temperature-controlled oven, and an outlet valve connected to a restrictor. The restrictor (50–100 micron fused silica tubing) would be used to control the pressure drop during depressurization of the system after reaction. A substrate would be placed in the reaction vessel to collect the condensed metal or metalloid particles produced in the supercritical phase. The powders produced from these procedures would be analyzed by a scanning electron microscope.

Copper di-hexafluoroacetylacetone propyl alcohol $[Cu(HFA)_2C_3H_7OH]$ can undergo a thermally induced disproportionation reaction to form copper metal and acetone.

Subsequent to disproportionation, particles of copper metal precipitate, or are otherwise deposited, onto the substrate. The in situ disproportionation of $Cu(HFA)_2C_3H_7OH$ in supercritical $CO_2$ is thus facilitated by raising the temperature sufficiently and maintaining this temperature for a period sufficient to produce copper metal.

Once the disproportionation reaction is complete, the copper metal can be easily collected, free from solvent hydrocarbon impurities, by simply reducing the pressure. Accordingly, the method described in this Example 7 also can be used to produce particles from other metal compounds by disproportionation.

Having illustrated and described the principles of the invention in several preferred embodiments, it should be apparent to those skilled in the art that the invention can be modified in arrangement and detail without departing from such principles. We claim all modifications coming within the spirit and scope of the following claims.

We claim:

1. A method for dissociating metals from metal compounds, comprising:
   providing a supercritical fluid including metal compounds comprising at least one metal; and
   treating the supercritical fluid including the metal compounds to dissociate the metal from the compounds in the supercritical fluid and form metal or metal oxide particles.

2. The method of claim 1 wherein the metal compounds are selected from the group consisting of coordination compounds, chelates, organometallics, metal halides, and mixtures thereof.

3. The method of claim 1 wherein the metal compounds comprise metal-ligand complexes.

4. The method of claim 3 wherein treating the supercritical fluid including the complexes comprises changing the oxidation state of the metal to dissociate the metal from the metal-ligand complex.

5. The method of claim 4 wherein changing the oxidation state of the metal comprises reducing the metal of the complex with a reducing agent.

6. The method of claim 5 wherein the reducing agent is hydrogen gas, and wherein treating the supercritical fluid including the complexes comprises applying the hydrogen gas to the supercritical fluid including the metal-ligand complexes.

7. The method of claim 4 wherein changing the oxidation state of the metal comprises treating the complex with an oxidizing agent.

8. The method of claim 3 wherein treating the supercritical fluid including the complexes comprises heating the metal-ligand complex.

9. The method of claim 3, further comprising recycling the ligand following treating the supercritical fluid including the metal-ligand complexes.

10. The method of claim 3, further comprising:
    providing a supercritical fluid selected from the group consisting of oxidizing agents and reducing agents; and
    changing the oxidation state of the metal with the supercritical fluid.

11. The method of claim 3 wherein the ligand is selected from the group consisting of crown ethers, halogenated crown ethers, trialkylphosphates, triarylphosphates, alkylarylphosphates, trialkylphosphine oxides, triarylphosphine oxides, alkylarylphosphine oxides, diketones, halogenated diketones, dithiocarbamates, carboxylic acids, halogenated carboxylic acids, phosphine sulfides, phosphorothioic acids, thiophosphinic acids, and mixtures thereof.

12. The method of claim 11 wherein the diketone is selected from the group consisting of β-diketones represented by the formula

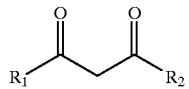

wherein $R_1$ and $R_2$ are independently selected from the group consisting of lower alkyl, fluorinated lower alkyl, thenoyl, fluorinated thenoyl, methyl, trifluoromethyl, ethyl, fluorinated ethyl, propyl, fluorinated propyl, butyl, and fluorinated butyl groups.

13. The method of claim 11 wherein the diketone is selected from the group consisting of acetylacetone, trifluoroacetylacetone, hexafluoroacetylacetone, thenoyltrifluoroacetylacetone, heptafluorobutanoylpivaroylmethane, and mixtures thereof.

14. The method of claim 11 wherein the diketone is selected from the group consisting of hexafluoroacetylacetone, dibutyldiacetate, and mixtures thereof.

15. The method according to claim 11 wherein the trialkyl, triaryl, or alkyl-arylphosphate is represented by the formula

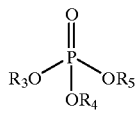

wherein $R_3$–$R_5$ are independently selected from the group consisting of lower alkyl groups and aryl groups, and wherein the trialkylphosphine oxide, triarylphosphine oxide and alkyl-arylphosphine oxide are represented by the formula

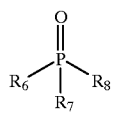

wherein $R_6$–$R_8$ are independently selected from the group consisting of lower alkyl groups and aryl groups.

16. The method according to claim 15 wherein $R_3$–$R_5$ are independently selected from the group consisting of butyl and octyl and wherein $R_6$–$R_8$ are independently selected from the group consisting of butyl, octyl and phenyl.

17. The method of claim 3 comprising solubilizing the complexes in the supercritical fluid.

18. The method of claim 3 comprising suspending the complexes in the supercritical fluid.

19. The method of claim 3 wherein the metal-ligand complex is dibutyl tin diacetate.

20. The method of claim 3 further comprising applying the supercritical fluid including the metal-ligand complexes to a substrate before, during, or after treating, to deposit the metal or metal oxide particles on the substrate.

21. The method of claim 20 further including heating the substrate.

22. The method of claim 1 wherein the supercritical fluid is carbon dioxide.

23. The method of claim 1 wherein the metal is selected from the group consisting of the transition metals.

24. The method of claim 1 wherein the metal is selected from the group consisting of copper, silver, gold, tungsten, titanium, tin, tantalum, and mixtures thereof.

25. The method of claim 1 wherein the metal is copper.

26. The method according to claim 1 wherein the supercritical fluid further includes a modifying solvent selected from the group consisting of water, lower alkyl alcohols, lower alkyl esters, phosphate esters, and mixtures thereof.

27. The method of claim 1 where particle size is controlled by changing temperature, pressure, ligand, oxidizing agent, reducing agent, supercritical fluid, reaction time, or combinations thereof.

28. The method of claim 27 where the particles have a particle size of about 1 μm.

29. The method of claim 1 wherein the particle size is substantially uniform.

30. A method for dissociating metal-ligand complexes, comprising:

forming a metal-ligand complex, or mixtures of metal-ligand complexes, the complex or complexes comprising at least one metal and at least one ligand;

dissolving or suspending the metal-ligand complex or complexes in a supercritical fluid, and treating the supercritical fluid including the complex or complexes to dissociate the ligand or ligands from the complex or complexes in the supercritical fluid, thereby forming metal or metal oxide particles.

31. The method of claim 30 wherein the metal of the complex or complexes is selected from the group consisting of copper, silver, gold, tungsten, titanium, tin, tantalum, and mixtures thereof, and wherein the metal-ligand complex or complexes are soluble in supercritical carbon dioxide.

32. A method for dissociating metal-ligand complexes, comprising:

providing supercritical carbon dioxide including a metal-ligand complex comprising copper and a ligand selected from the group consisting of β-diketones, the supercritical carbon dioxide including the complex occupying a first volume; and reducing the metal from a first oxidation state to a lower oxidation state while maintaining the supercritical fluid including the complex at substantially the first volume, thereby dissociating the ligand from the complex and forming in the supercritical fluid substantially uniform copper or copper oxide particles.

33. A method for dissociating metal-ligand complexes, comprising:

providing a supercritical fluid including a metal-ligand complex, or mixtures of metal-ligand complexes, the complex or complexes comprising at least one metal and at least one ligand; and treating the supercritical fluid including the complex or complexes to dissociate the ligand from the metal in the supercritical fluid and form metal or metal oxide particles while maintaining the supercritical fluid at substantially the same volume.

34. The method of claim 33 wherein treating the supercritical fluid including the complex or complexes comprises changing the oxidation state of the metal to dissociate the metal from the metal-ligand complex or complexes.

35. The method of claim 34 wherein changing the oxidation state of the metal comprises reducing the metal of the complex or complexes with a reducing agent.

36. The method of claim 35 wherein the reducing agent is hydrogen gas, and wherein treating the supercritical fluid including the complex or complexes comprises applying the hydrogen gas to the supercritical fluid including the metal-ligand complex or complexes.

37. The method of claim 34 wherein changing the oxidation state of the metal comprises treating the complex with an oxidizing agent.

38. The method of claim 34 wherein the metal-ligand complex is dibutyl tin diacetate.

39. The method of claim 33 further comprising applying the supercritical fluid including the metal-ligand complex or complexes to a substrate during or after treating to deposit the metal or metal-oxide particles onto the substrate.

40. The method of claim 39 further including heating the substrate.

41. The method of claim 33 wherein treating the supercritical fluid including the complex or complexes comprises heating the metal-ligand complex or complexes.

42. The method of claim 33 further including recycling the ligand following treating the supercritical fluid including the metal-ligand complexes.

43. The method of claim 33 wherein the supercritical fluid is carbon dioxide.

44. The method of claim 33 wherein the metal is selected from the group consisting of copper, silver, gold, tungsten, titanium, tin, tantalum, and mixtures thereof.

45. The method of claim 33 wherein the metal is copper.

46. The method of claim 33 wherein the ligand is selected from the group consisting of crown ethers, halogenated crown ethers, trialkylphosphates, triarylphosphates, alkylarylphosphates, trialkylphosphine oxides, triarylphosphine oxides, alkylarylphosphine oxides, diketones, halogenated diketones, dithiocarbamates, carboxylic acids, halogenated carboxylic acids, phosphine sulfides, phosphorothioic acids, thiophosphinic acids, and mixtures thereof.

47. The method of claim 46 wherein the diketone is selected from the group consisting of hexafluoroacetylacetone, dibutyldiacetate, and mixtures thereof.

48. The method according to claim 33 wherein the supercritical fluid further includes a modifying solvent selected from the group consisting of water, lower alkyl alcohols, lower alkyl esters, phosphate esters, and mixtures thereof.

49. The method of claim 33 where particle size is controlled by changing a variable selected from the group consisting of temperature, pressure, ligand, oxidizing agent, reducing agent, supercritical fluid, reaction time, and combinations thereof.

50. The method of claim 49 where the particles have a particle size of about 1 μm.

51. The method of claim 33 wherein the particle size is substantially uniform.

52. Metal and/or metal oxide products produced according to the method of claim 33.

53. A method for dissociating metal-ligand complexes, comprising:

forming, in a supercritical fluid, a metal-ligand complex, or mixtures of metal-ligand complexes, the complex or complexes comprising at least one metal and at least on ligand; and treating the supercritical fluid including the complex or complexes to dissociate the ligand from the metal in the supercritical fluid and form metal or metal oxide particles.

54. A method for dissociating metal-ligand complexes, comprising:

providing a supercritical fluid including a metal-ligand complex, or mixtures of metal-ligand complexes, the complex or complexes comprising a metal and a ligand; and treating the supercritical fluid including the complex or complexes to dissociate the ligand from the complex or complexes in the supercritical fluid wherein the treating is for a time effective to form substantially uniform metal or metal-oxide particles.

55. The method according to claim 54 further including disproportionating the metal-ligand complex during the step of treating the supercritical fluid.

* * * * *

UNITED STATES PATENT AND TRADEMARK OFFICE
CERTIFICATE OF CORRECTION

PATENT : 6,132,491

DATED : October 17, 2000

INVENTOR(S) : Wai et al.

It is certified that error appears in the above-identified patent and that said Letters Patent is hereby corrected as shown below:

| Col./Line | | Should Read |
|---|---|---|
| 2/8 | method-is | method is |
| 5/61 | triaryiphosphine | triarylphosphine |
| 11/50 | 45 minutes, | 45 minutes. |
| 12/26 | gaskets 56 | gaskets 56. |
| 13/1 | 120 atm), | 120 atm). |
| 19/22 | fluid, and | fluid; and |

Signed and Sealed this

Fifteenth Day of May, 2001

Attest:

NICHOLAS P. GODICI

Attesting Officer

Acting Director of the United States Patent and Trademark Office